United States Patent
Poplevine et al.

(10) Patent No.: US 6,285,590 B1
(45) Date of Patent: Sep. 4, 2001

(54) LOW POWER CONSUMPTION SEMICONDUCTOR ROM, EPROM, EEPROM AND LIKE CIRCUIT

(75) Inventors: Pavel Poplevine, Foster City; Jasopin Lee, Cupertino; Derek Tao, San Francisco, all of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/605,291

(22) Filed: Jun. 28, 2000

(51) Int. Cl.[7] .................................................. G11C 11/34
(52) U.S. Cl. ...................................... 365/185.21; 365/207
(58) Field of Search ................................ 365/207, 185.21

(56) References Cited

U.S. PATENT DOCUMENTS 6,141,277 * 10/2000 Tanzawa ............................... 365/207

* cited by examiner

Primary Examiner—David Nelms
Assistant Examiner—M. Tran
(74) Attorney, Agent, or Firm—Pillsbury Winthrop LLP

(57) ABSTRACT

A low power consumption semiconductor memory circuit that includes a memory core (e.g., a ROM core) with a plurality of intersecting bit lines and word lines, as well as a plurality of memory cells at predetermined intersections of the bit and word lines. The low power consumption semiconductor memory circuit also includes a pre-discharge circuit, a multiplexer circuit (MUX), and a sense amplifier circuit. The pre-discharge circuit is electrically connected to the memory core and configured for discharging each of the bit lines to ground (GND). The MUX circuit is electrically connected to the pre-discharge circuit and configured for selecting at least one of the bit lines as its input. Furthermore, the sense amplifier circuit is configured for sensing an electrical state of an output node of the MUX circuit and, in one embodiment, includes a current generator circuit configured to charge a pre-discharged bit line during a READ operation. Low current and power consumption is achieved during operation by pre-discharging (instead of pre-charging) bit lines of the memory core to ground (GND) prior to a READ operation. Thereafter, during a READ operation, the low power consumption semiconductor memory circuits use a sense amplifier circuit and, for example, an associated reference voltage input to sense changes in the electrical state (e.g., voltage state) of a bit line that has been selected by the MUX circuit.

28 Claims, 3 Drawing Sheets

LOW POWER CONSUMPTION SEMICONDUCTOR ROM, EPROM, EEPROM AND LIKE CIRCUIT

BACKGROUND OF THE INVENTION

1. Field of the Invention

The present invention relates to semiconductor memory circuits and, in particular, to semiconductor memory circuits capable of operating with low current and power consumption.

2. Description of the Related Art

Semiconductor memory circuits (e.g., dynamic random-access memory [DRAM] circuits, static random-access memory [SRAM] circuits, read-only memory [ROM], and programmable read-only memory [PROM] circuits) which can store and retrieve digital data (i.e., either a logic 1 or 0) are widely used in electronic devices. Such semiconductor memory circuits can be based on bipolar and/or metal-oxide-semiconductor (MOS) transistors.

FIG. 1 is an electrical schematic of a conventional NMOS semiconductor ROM circuit 10. NMOS semiconductor ROM circuit 10 includes a ROM memory core 12, a pre-charge circuit 14, and multiplexer (MUX) circuit 16 and a sense amplifier circuit 18.

The ROM memory core 12 includes a plurality (namely, m numbers) of bit lines (20a to 20m) and a plurality (namely, n numbers) of word lines (22a to 22n). The bit lines (a.k.a. physical columns) and word lines (a.k.a. physical rows) are arranged in an intersecting manner with NMOS transistors 24 at predetermined intersections thereof. The NMOS transistors 24 serve as memory cells of the ROM memory core 12. Since the memory cells (that is, NMOS transistors 24) are present only at predetermined intersections of the bit lines and word lines, ROM memory core 12 is known as a "ROM memory core with code."

The pre-charge circuit 14 includes a plurality of interconnected PMOS transistors 26. Each of the PMOS transistors 26 is electrically connected to one of the bit lines (20a to 20m) and to $V_{DD}$ (power supply voltage). The pre-charge circuit 14 is configured to pre-charge the bit lines (20a to 20m) to $V_{DD}$ prior to an operation of reading digital data from the memory core (i.e., prior to a "READ" operation).

The MUX circuit 16 includes a plurality of semiconductor device switches 28 and an output node 30. Each of the semiconductor device switches 28 is electrically connected to the pre-charge circuit 14 in a manner that provides for the MUX circuit 16 to select each of the bit lines (20a to 20m) as an input to the MUX circuit 16.

The sense amplifier circuit 18 is configured to sense the electrical state (e.g., the voltage state) of the output node 30 of the MUX circuit 16. The sense amplifier circuit 18 includes an input line 32 electrically connected to the output node 30 of the MUX circuit 16, an optional input reference line 34 and a sense amplifier circuit output line 36.

In conventional NMOS semiconductor ROM circuits, two types of conventional circuits are commonly employed as the sense amplifier circuit 18, namely a conventional differential amplifier circuit 40 (shown in FIG. 2) and a conventional inverter with a feedback pull-up circuit 60 (shown in FIG. 3). Conventional differential amplifier circuit 40 includes a plurality of interconnected MOS transistors 42. Conventional differential amplifier circuit 40 is configured to receive a reference signal, an input signal from the MUX circuit, and a control signal, as well as to provide an "out" signal in response (as illustrated in FIG. 2). The conventional inverter with a feedback pull-up circuit 60 is configured to receive an input signal, as well as to provide an "out" signal (as illustrated in FIG. 3).

Typically, during the operation of conventional semiconductor memory circuits, such as the NMOS semiconductor ROM circuit illustrated in FIG. 1, all bit lines are pre-charged to VDD by the pre-charge circuit prior to a READ operation. If the digital data to be read from a predetermined bit line is a digital 0, then the bit line will have been discharged to ground (i.e., a digital 0 or a "low" state) through a memory cell subsequent to its having been pre-charged. On the other hand, if the digital data to be read from the predetermined bit line is a digital 1, then the pre-charged bit line will be in a high impedance state (i.e., a digital 1 or a "high" state). The discharged to ground or high impedance state of the predetermined bit line is sensed and amplified by the sense amplifier circuit.

If, prior to the pre-charging of the bit lines, all the programmed digital data of the memory core are digital 0s, then the amount of current and power consumed during the pre-charging of the bit lines will be undesirably large. Furthermore, the greater the number of bit lines, the greater the consumption of current and power during a pre-charge operation. In a ROM core with a large number of bit lines and word lines, the power consumption required to pre-charge the bit lines can constitute the majority of the total power consumption of the semiconductor memory circuit. Further descriptions of conventional semiconductor memory circuits, their component circuits (e.g., ROM cores, pre-charge circuits and sense amplifier circuits) and their operation can be found in R. J. Baker, H. W. Li, and D. E. Boyce, *CMOS Circuit Design, Layout, and Simulation*, 260–263 and 331–354 (IEEE Press, 1997) and P. R. Gray and R. G. Meyer, *Analysis and Design of Analog Integrated Circuits*, 269–353 (John Wiley & Sons, 1993), the disclosures of which are hereby fully incorporated by reference.

Still needed in the field, therefore, is a semiconductor memory circuit that provides for low current and power consumption during its operation. Also, it would be preferable for such a low power consumption semiconductor memory circuit to provide relatively high performance (i.e., speed).

SUMMARY OF THE INVENTION

The present invention provides a semiconductor memory circuit that can be operated with a relatively low current and power consumption (i.e., a low power consumption semiconductor memory circuit). Low power consumption semiconductor memory circuits according to the present invention include a memory core, such as a ROM core, with a plurality of intersecting bit lines and word lines and a memory cell at predetermined intersections of the bit lines and word lines. The low power consumption semiconductor memory circuit also includes a pre-discharge circuit, a multiplexer (MUX) circuit and a sense amplifier circuit.

The pre-discharge circuit is electrically connected to the memory core and configured for discharging each of the bit lines to ground (GND). The MUX circuit includes an output node. The MUX circuit is electrically connected to the pre-discharge circuit and is configured for selecting only one of the bit lines as an input to the MUX circuit.

The sense amplifier circuit of low power consumption semiconductor memory circuits according to the present invention is configured for sensing an electrical state of the output node of the MUX circuit. The sense amplifier circuit includes an input node electrically connected to the output node of the MUX circuit, only one input reference line for receiving an input reference signal and a sense amplifier circuit output node. In one embodiment, the sense amplifier circuit includes a current generator circuit configured to charge a pre-discharged bit line during a READ operation.

Low current and power consumption characteristics of low power consumption semiconductor memory circuits according to the present invention are achieved by providing a pre-discharge circuit, instead of the conventional pre-charge circuit. The low power consumption semiconductor memory circuits are, thus, able to operate with relatively low power consumption by pre-discharging (rather than pre-charging) bit lines of the memory core to ground (GND) prior to a READ operation. Thereafter, during a READ operation, the low power consumption semiconductor memory circuits use a sense amplifier circuit and, for example, an associated reference voltage input and current generator circuit, to sense changes in the electrical state (e.g., voltage state) of a bit line that has been selected by the MUX circuit. If, for example, the bit line voltage is larger than the reference voltage input to the sense amplifier circuit, an "OUT" signal from the sense amplifier circuit will be "high" (a logic 1); otherwise, the "OUT" signal will be "low" (a logic 0).

Since all bit lines of low power consumption semiconductor memory circuits according to the present invention are pre-discharged to ground (GND) prior to a READ operation, only the bit lines which are selected by the MUX circuit during a READ operation consume power. Where #cn (a.k.a. MUX configuration number) is the number of bit lines divided by the number of logical columns, only 1/#cn of the total bit lines consume power. Thus, the total pre-charge current and power consumption of low power consumption semiconductor memory circuits according to the present invention is only 1/#cn of the total pre-charge current and power consumption of a conventional semiconductor memory circuits.

In another embodiment, power consumption can be further reduced and performance (i.e., speed) increased by employing a sense amplifier circuit that includes two voltage input reference nodes for receiving different voltage reference signals. By employing two reference voltages, the sense amplifier circuit can be configured to complete its sensing of a selected bit line's electrical state at a lower voltage, thereby increasing the performance (i.e., speed) of the low power consumption semiconductor memory circuit and further reducing its power consumption.

BRIEF DESCRIPTION OF THE DRAWINGS

A better understanding of the features and advantages of the present invention will be obtained by reference to the following detailed description that sets forth illustrative embodiments, in which the principles of the invention are utilized, and the accompanying drawings, of which.

DETAILED DESCRIPTION OF THE INVENTION

Figure 4:
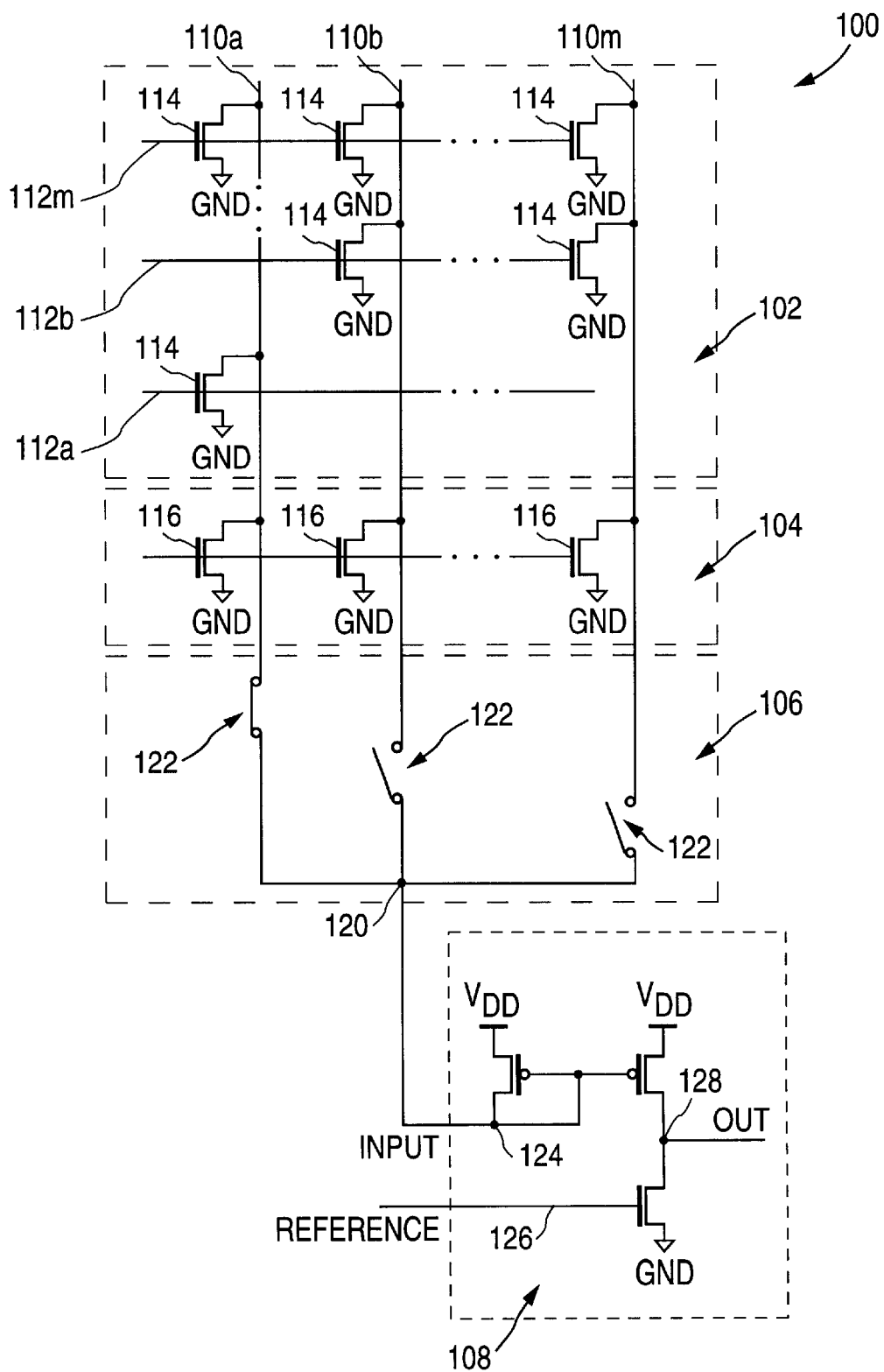
FIG. 4 is an electrical schematic illustrating a low power consumption semiconductor memory circuit according to the present invention. The dashed rectangles indicate the general boundaries of various circuits within the low power consumption NMOS semiconductor ROM circuit.

FIG. 4 illustrates a low power consumption semiconductor memory circuit 100 according to the present invention. Low power consumption semiconductor memory circuit 100 includes a memory core 102, a pre-discharge circuit 104, a MUX circuit 106 and a sense amplifier circuit 108.

Memory core 102 is a ROM memory core that includes a plurality of intersecting bit lines (110a–110m, a.k.a. physical columns) and word lines (112a–112m, a.k.a. physical rows). Memory core 102 also includes memory cells (i.e., NMOS transistors 114) at predetermined intersections of the bit lines and word lines. The memory core 102 can, therefore, be referred to as a NMOS core and the low power consumption semiconductor memory circuit 100 can be referred to as a low power consumption ROM circuit. Furthermore, since the NMOS transistors 114 are provided only at predetermined intersections, the memory core 102 is also referred to as an "NMOS core with code." Those skilled in the art will recognize that memory core 102 can take other forms, such as an Erasable Programmable Read-Only Memory (EPROM) core or an Electrically Erasable Programmable Read-Only Memory (EEPROM) core. Memory core 102 can be configured using PMOS transistors to provide a low power CMOS semiconductor memory circuit.

Pre-discharge circuit 104 is electrically connected to the bit lines (110a–110m) of the memory core 102 and configured for discharging each of the bit lines to ground (GND) through a plurality of interconnected MOS transistors 116. MUX circuit 106 includes an output node 120 and a plurality of semiconductor device switches 122. The MUX circuit 106 is electrically connected to the pre-discharge circuit 104 and configured for selecting at least one of the bit lines (110a–110m) as an input to the MUX circuit 106.

Figure 1:
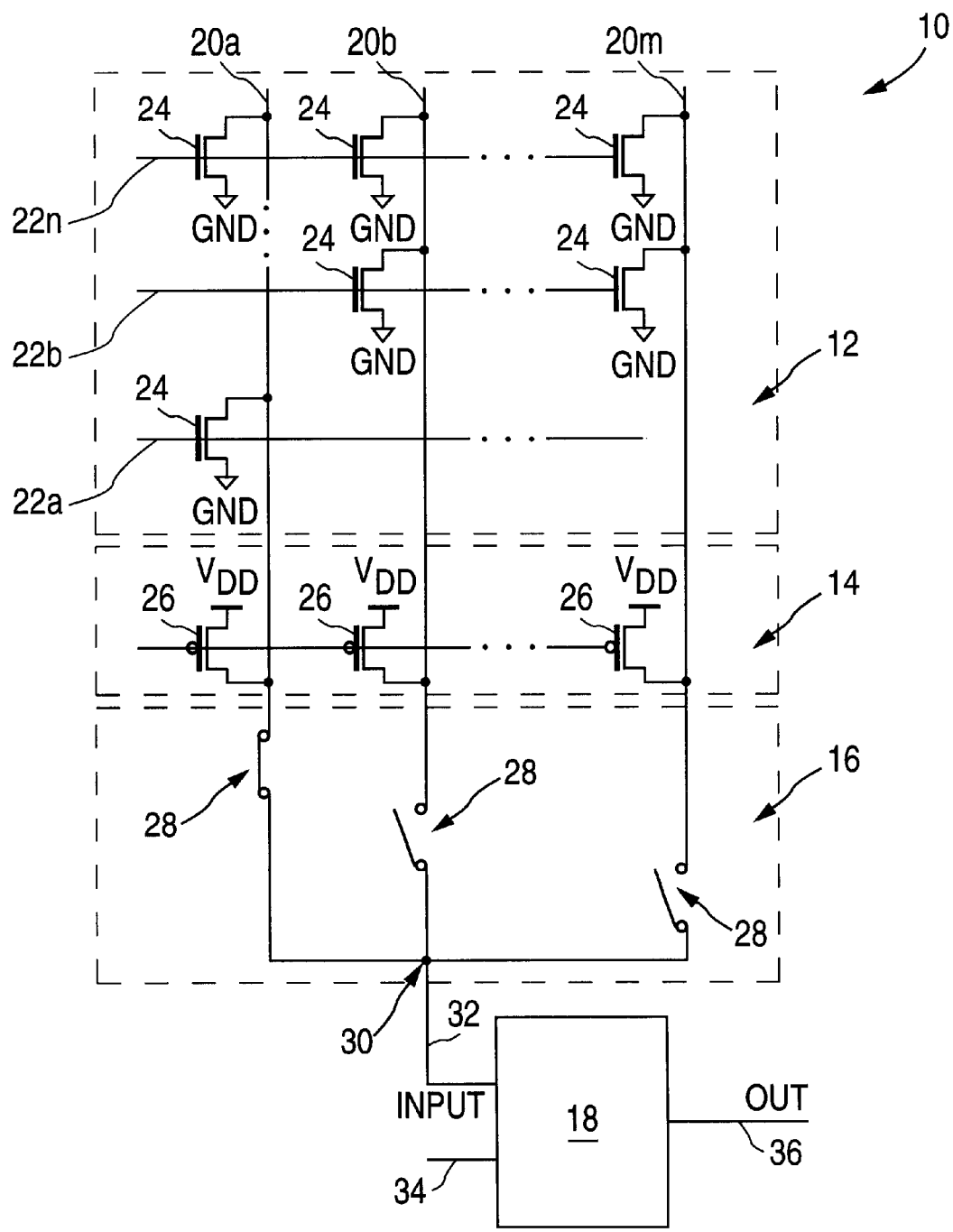
FIG. 1 is an electrical schematic illustrating the architecture of a conventional NMOS semiconductor ROM circuit. The dashed rectangles indicate the general boundaries of various circuits within the conventional NMOS semiconductor ROM circuit.
Figure 2:
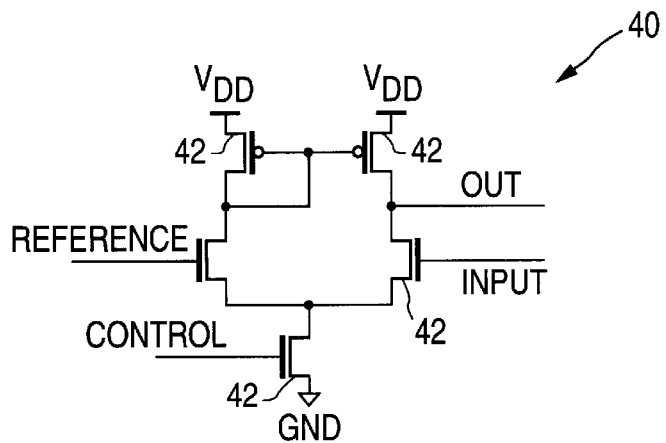
FIG. 2 is an electrical schematic illustrating a conventional differential amplifier for use as a sense amplifier circuit in the conventional NMOS semiconductor ROM circuit of FIG. 1.
Figure 3:
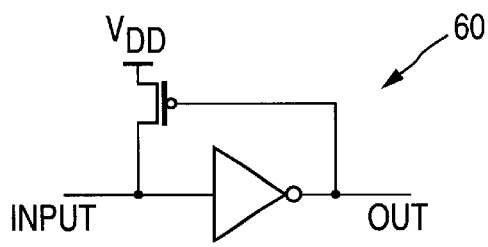
FIG. 3 is an electrical schematic of a conventional single inverter with a feedback pull-up circuit for use as a sense amplifier circuit in the conventional NMOS semiconductor ROM circuit of FIG. 1.

In the embodiment illustrated in FIG. 1, there are m bit lines connected to MUX circuit 106 and one output (i.e., one logical column) exiting MUX circuit 106 (and entering the sense amplifier circuit 108 as an INPUT) from the output node 120. The MUX configuration number (#cn) for the embodiment illustrated in FIG. 4 is, therefore, m/1. If, for example, the total number of bit lines "m" were to equal 8, the MUX configuration number would be 8. Other MUX configuration numbers, for example, 2, 4, 6, 8, 16 and 72, are however, known in the art. The MUX circuit 106 essentially serves as a connector for selectively connecting the bit lines to the sense amplifier circuit 108. MUX circuit 106 can take the form of any suitable MUX circuit known in the art, including that of a Y-decoder.

Sense amplifier circuit 108 is configured for sensing the electrical state (e.g., the voltage state or impedance state) of the output node 120 of the MUX circuit 106. The sense amplifier circuit 108 includes an input node 124 electrically connected to the output node 120 of the MUX circuit 106, at least one input reference line 126 and a sense amplifier circuit output node 128. As illustrated in FIG. 4, the sense amplifier circuit 108 also includes a plurality of interconnected MOS transistors 130.

Figure 5:
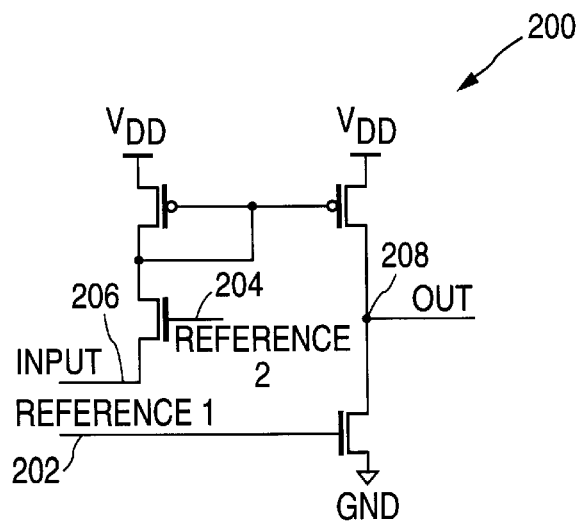
FIG. 5 is an electrical schematic illustrating a current sense amplifier circuit for use in the low power consumption semiconductor memory circuit of FIG. 4.

It is preferred that the sense amplifier circuit 108 possess the capability of operating as a current generator by, for example, including a current generator circuit, and be configured to charge a pre-discharged bit line during a READ operation of the low power consumption semiconductor memory circuit. The sense amplifier circuit 108 can, therefore, take the form of known current mirror circuits, such as a sense amplifier circuit 200 depicted in FIG. 5. Sense amplifier circuit 200 includes two input reference lines 202 and 204 for receiving reference signals "reference 1" and "reference 2," respectively. Sense amplifier circuit 200 also includes an input line 206 for connection to the output node 120 of the MUX circuit 106, as well as a sense amplifier circuit output node 208.

By employing a second reference signal "reference 2" (e.g., a voltage signal) that is less than the "reference 1," sense amplifier circuit 200 can complete its sensing of a selected bit line's electrical state at a lower voltage, thereby increasing the performance (i.e., speed) of the low power consumption semiconductor memory circuit 100 and further reducing its power consumption. For example, if $V_{DD}$ is 2.5 volts, and the threshold voltage of the MOS transistors employed in the low power consumption semiconductor memory circuit is 0.5 volts, a typical "reference 1" voltage signal would be 2.0 volts, while a "reference 2" voltage signal would be 0.5 volts. The configuration of the sense amplifier circuit 200 illustrated in FIG. 5 would then enable the sensing of a selected bit line's electrical state once only 0.5 volts were sensed on input line 206. By sensing the electrical state of a selected bit line at such a relatively low input line voltage, the performance (i.e., speed) of the low power consumption semiconductor memory circuit is increased.

Low power consumption semiconductor memory circuits according to the present invention provide for relatively low power operation by employing a pre-charge circuit to discharge bit lines in a memory core to ground (GND) prior to a READ operation, rather than pre-charging the bit lines to $V_{DD}$ as in conventional semiconductor memory circuits. The sense amplifier circuit is then used to sense the electrical state (e.g., a voltage state or an impedance state) of a bit line that has been selected by the MUX circuit. Since the bit line has been pre-discharged to ground (GND), it is preferable that the sense amplifier circuit included in low power consumption semiconductor memory circuits according to the present invention be configured to apply a charge to the selected bit line and thereby facilitate sensing its electrical state. After the electrical state of a selected bit line has been sensed by the sense amplifier circuit, the selected bit line can again be pre-discharged to ground (GND) by the pre-discharge circuit.

It should be noted that in low power consumption semiconductor memory circuits according to the present invention, the bit lines which were not selected by the MUX circuit (usually referred to as "non-selected bit lines") remain discharged, while the selected bit line is sensed by the sense amplifier circuit. The result is that only a selected bit line consumes current and power during operation of the low power consumption semiconductor memory circuit. The current and power consumption of low power consumption semiconductor memory circuits according to the present invention is, therefore, reduced by a factor of 1 divided by the MUX configuration number, namely 1/#cn, over conventional semiconductor memory circuits. For example, if the MUX configuration number is 8, the current and power consumption required to charge bit lines is reduced to ⅛ of that required to pre-charge bit lines in a conventional semiconductor memory circuit.

It should be understood that various alternatives to the embodiments of the invention described herein may be employed in practicing the invention. It is intended that the following claims define the scope of the invention and that structures within the scope of these claims and their equivalents be covered thereby.

What is claimed is:

1. A low power consumption semiconductor memory circuit comprising:
   a memory core with a plurality of intersecting bit lines and word lines and a memory cell at predetermined intersections of the bit lines and word lines;
   a pre-discharge circuit electrically connected to the memory core and configured for discharging each of the bit lines to ground;
   a multiplexer (MUX) circuit with an output node, the MUX circuit electrically connected to the pre-discharge circuit and configured for selecting at least one of the bit lines as an input to the MUX circuit; and
   a sense amplifier circuit configured for sensing an electrical state of the output node of the MUX circuit, the sense amplifier circuit including an input node electrically connected to the output node of the MUX circuit, at least one input reference line for receiving an input reference signal and a sense amplifier circuit output node.

2. The low power consumption semiconductor memory circuit of claim 1 wherein the memory core is a Read-Only Memory (ROM) core.

3. The low power consumption semiconductor memory circuit of claim 2 wherein the ROM core is an Erasable Programmable Read-Only Memory (EPROM) core.

4. The low power consumption semiconductor memory circuit of claim 2 wherein the ROM core is an Electrically Erasable Programmable Read-Only Memory (EEPROM) core.

5. The low power consumption semiconductor memory circuit of claim 2 wherein the ROM core is a ROM core with code.

6. The low power consumption semiconductor memory circuit of claim 1 wherein each of the memory cells includes a metal-oxide-semiconductor MOS) transistor.

7. The low power consumption semiconductor memory circuit of claim 6 wherein each of the memory cells includes an NMOS transistor.

8. The low power consumption semiconductor memory circuit of claim 1 wherein the pre-discharge circuit includes a plurality of interconnected metal-oxide-semiconductor (MOS) transistors and each of the pre-discharge circuit's interconnected MOS transistors is electrically connected to a bit line of the memory core and to ground.

9. The low power consumption semiconductor memory circuit of claim 6 wherein the sense amplifier circuit includes a current generator circuit and is configured to charge a pre-discharged bit line during a READ operation of the low power consumption semiconductor memory circuit.

10. The low power consumption semiconductor memory circuit of claim 1 wherein the sense amplifier senses the voltage state of the output node of the MUX circuit.

11. The low power consumption semiconductor memory circuit of claim 1 wherein the sense amplifier includes an inverter.

12. The low power consumption semiconductor memory circuit of claim 1 wherein the sense amplifier includes a current mirror circuit.

13. The low power consumption semiconductor memory circuit of claim 1 wherein the sense amplifier includes two voltage input reference lines for receiving voltage reference signals.

14. The low power consumption semiconductor memory circuit of claim 1 wherein the MUX circuit is a Y-decoder circuit.

15. A low power consumption Read-Only Memory (ROM) circuit comprising:
   a read-only memory (ROM) core with a plurality of intersecting bit lines and word lines and memory cells at predetermined intersections of the bit lines and word lines, each of the memory cells including an NMOS transistor;
   a pre-discharge circuit electrically connected to the ROM core and configured for discharging each of the bit lines to ground;
   a multiplexer (MUX) circuit with an output node, the MUX circuit electrically connected to the pre-discharge circuit and configured for selecting at least one of the bit lines as an input to the MUX circuit; and
   a sense amplifier circuit configured for sensing electrical changes in the output node of the MUX circuit and generating current for charging a bit line of the ROM core, the sense amplifier circuit including an input node electrically connected to the output node of the MUX circuit, at least one input reference line and a sense amplifier circuit output node.

16. The low power consumption ROM circuit of claim 15 wherein the pre-discharge circuit, MUX circuit and sense amplifier circuit comprise a plurality of interconnected metal-oxide-semiconductor (MOS) transistors.

17. The low power consumption ROM circuit of claim 15 wherein each of the pre-discharge circuit's plurality of interconnected MOS transistors is electrically connected to a bit line of the ROM core and to ground.

18. A memory comprising:
   a plurality of bit lines;
   a plurality of memory cells connected to the bit lines;
   a multiplexor having a plurality of first terminals connected to the bit lines and a second terminal;
   a discharge circuit having a plurality of discharge transistors connected to the bits lines so that a discharge transistor is continuously connected to each bit line; and
   a sense amplifier connected to the second terminal of the multiplexor.

19. The memory of claim 18 wherein the sense amplifier sources current into the second terminal when data is read from the memory cells.

20. The memory of claim 19 wherein the memory cells are arranged in rows and columns and each memory cell in a row is connected to a different bit line.

21. The memory of claim 19 wherein the plurality of discharge transistors have a plurality of gates that are electrically connected together.

22. The memory of claim 18 wherein the sense amplifier includes:
   a first transistor having a first terminal connected to a power supply, a second terminal, and a third terminal connected to the first terminal;
   a second transistor having a first terminal connected to the power supply, a second terminal connected to the second terminal of the first transistor, and a third terminal; and
   a third transistor having a first terminal connected to ground, a second terminal connected to a reference voltage node, and a third terminal connected to the third terminal of the second transistor.

23. The memory of claim 22 wherein the third terminal of the first transistor is connected to the second terminal of the multiplexor.

24. The memory of claim 22 and further comprising:
   a fourth transistor having a first terminal connected to the second terminal of the multiplexor, a second terminal connected to a reference voltage node, and a third terminal connected to the third terminal of the first transistor.

25. A method for operating a memory, the memory comprising:
   a plurality of bit lines;
   a plurality of memory cells connected to the bit lines, the memory cells being arranged in rows and columns such that each memory cell in a row is connected to a different bit line;
   a multiplexor having a plurality of first terminals connected to the bit lines and a second terminal;
   a discharge circuit having a plurality of discharge transistors connected to the bits lines so that a discharge transistor is connected to each bit line; and
   a sense amplifier connected to the second terminal of the multiplexor,
   the method comprising the steps of:
      selecting a row of memory cells;
      selecting a bit line with the multiplexor such that the voltage from only one bit line is coupled to the second terminal of the multiplexor, each bit line having a voltage, a to-be-read memory cell being identified by a selected row of memory cells and a selected bit line;
      pulling down the voltages on the bit lines with the discharge circuit; and
      sourcing current into the second terminal of the multiplexor with the sense amplifier after the voltage on the bit lines has been pulled down.

26. The method of claim 25 wherein the to-be-read memory cell sinks a current when storing a first logic state, and does not sink a current when storing a second logic state.

27. The method of claim 26 wherein the current sourced by the sense amplifier forms a first voltage in the sense amplifier when the to-be-read memory cell stores the first logic state, and a second voltage in the sense amplifier when the to-be-read memory cell stores the second logic state, the second voltage being greater than the first voltage.

28. The method of claim 27 wherein when a voltage on the second terminal of the multiplexor exceeds a value that is greater than a reference voltage less a threshold voltage, the sense amplifier forms the second voltage and stops sourcing current.

* * * * *

UNITED STATES PATENT AND TRADEMARK OFFICE
CERTIFICATE OF CORRECTION

PATENT NO. : 6,285,590 B1  Page 1 of 1
DATED : September 4, 2001
INVENTOR(S) : Poplevine et al.

It is certified that error appears in the above-identified patent and that said Letters Patent is hereby corrected as shown below:

Column 6,
Line 40, delete "MOS)" and replace with -- (MOS) --.

Signed and Sealed this

Twelfth Day of March, 2002

*Attest:*

JAMES E. ROGAN
*Attesting Officer*  *Director of the United States Patent and Trademark Office*